US008796740B1

(12) United States Patent
Landis et al.

(10) Patent No.: US 8,796,740 B1

(45) Date of Patent: Aug. 5, 2014

(54) USING A SINGLE MASK FOR VARIOUS DESIGN CONFIGURATIONS

(75) Inventors: Lawrence David Landis, Pleasanton, CA (US); Richard Price, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 12/352,705

(22) Filed: Jan. 13, 2009

(51) Int. Cl.
*H01L 25/065* (2006.01)

(52) U.S. Cl.
USPC .................................. 257/210; 257/E25.012

(58) Field of Classification Search
USPC .......... 257/202, 203, 208, 210, 211, E21.602, 257/E25.012; 438/113, 114, 128, 462
See application file for complete search history.

(56) References Cited

U.S. PATENT DOCUMENTS

| | | | | |
|---|---|---|---|---|
| 5,386,623 A * | 2/1995 | Okamoto et al. | ............... | 29/832 |
| 5,430,734 A * | 7/1995 | Gilson | .......................... | 714/725 |
| 5,831,330 A * | 11/1998 | Chang | .......................... | 257/620 |
| 6,157,213 A * | 12/2000 | Voogel | .......................... | 326/41 |
| 6,424,315 B1 * | 7/2002 | Glenn et al. | .................. | 343/895 |
| 6,735,755 B2 * | 5/2004 | Shau | .......................... | 326/101 |
| 2007/0158788 A1 * | 7/2007 | Yang | .......................... | 257/620 |

* cited by examiner

*Primary Examiner* — Daniel Shook

(74) *Attorney, Agent, or Firm* — Womble Carlyle Sandridge & Rice, LLP

(57) ABSTRACT

Techniques and design methodologies for using a single mask set to create devices of different sizes are disclosed. A mask with a plurality of tiles is disclosed. Each of the tiles has a number of fixed resource blocks, multiple logic blocks and is surrounded by a scribe region. The tiles may be connected to one or more adjacent tiles through interconnect lines that enable the fixed resource blocks and logic blocks in one tile to communicate with the fixed resource and logic blocks in an adjacent tile. The mask set may be used to produce devices of different sizes. Using a mask set that can handle a variety of design sizes with varying resources may in turn reduce mask cost.

20 Claims, 7 Drawing Sheets

USING A SINGLE MASK FOR VARIOUS DESIGN CONFIGURATIONS

BACKGROUND

Integrated circuits are usually fabricated on a semiconductor wafer. During the manufacturing process, a stepper machine is used to move the processing arm to print images, i.e. dies, on a wafer. The pattern on the photomask (also called a reticle) is exposed repeatedly side by side on the surface of the wafer. Multiple dies are usually formed on the surface of a single wafer. Depending on the size of the die, in some cases, multiple die patterns can be included on a single reticle to reduce the cost for the reticle set.

Multiple layers of these reticle images make up a device. Normally, each different layer will be formed by a different reticle, and as the number of layers in a device increases with each technology node, the mask set cost to produce a device increases. Furthermore, in order to produce a different device, e.g., a device of a different size or a device with more resources, a new reticle set would normally be required, further increasing the mask cost. In order to reduce the cost of a device, the number of masks required to produce a single device needs to be reduced. The cost of the device can then be lowered by maximizing the reusability of a single mask set and a more cost effective solution can be achieved by sharing mask sets for multiple devices.

It would therefore be advantageous if a single mask set can be used to handle a variety of design sizes with varying resources. In other words, the same mask set can be used to create a number of different devices with different configurations.

SUMMARY

Embodiments of the present invention provide various techniques that allow a single mask set to be used for designing and manufacturing semiconductor devices or integrated circuits of various sizes. The invention utilizes a single mask set that can handle a variety of devices of different sizes without creating a new mask set for each different device.

It should be appreciated that the present invention can be implemented in numerous ways, such as a process, an apparatus, a system, a device or a method. Several inventive embodiments of the present invention are described below.

In one embodiment, a wafer with a plurality of tiles is disclosed. Each tile has a number of fixed resource blocks which include, among other things, memory blocks, I/O banks, transceivers, and auxiliary circuits. Each of the tiles also has a plurality of logic blocks which include logic cells and gates used for implementing the intended logic function. A scribe region surrounds each individual tile. In one embodiment, the scribe region is used for sawing the tile from the wafer. Each tile can be configured to connect to one or more adjacent tiles through interconnect lines that connect the resource blocks and logic blocks in one tile to the resource blocks and logic blocks in another tile.

In another embodiment, another wafer is disclosed. The wafer has a plurality of tiles. Each tile has multiple resource blocks and a customizable die seal surrounding the resource blocks in the tile. The die seal can be customized to connect each of the tiles to an adjacent tile. A scribe region surrounds an outer boundary of the die seal of each of the tiles. The wafer has a plurality of dies formed from the tiles on the wafer. Each die can be formed by either a single tile or multiple tiles connected together. In one embodiment, the die seal has an opening to route interconnect lines to connect one tile to one or more adjacent tiles.

In yet another embodiment in accordance with the present invention, a method of manufacturing an integrated circuit (IC) is disclosed. The method includes creating multiple tile patterns on a wafer. Each of the tile patterns has numerous fixed resources. A die seal with an opening is created. The die seal surrounds the fixed resources in each of the tile patterns. Two or more adjacent tile patterns on the wafer are connected through the opening in the die seal. The wafer is cut along scribe lines on the wafer. Numerous ICs are formed by cutting the wafer along the scribe lines to separate the multiple tile patterns on the wafer.

Other aspects of the invention will become apparent from the following detailed description, taken in conjunction with the accompanying drawings, illustrating by way of example the principles of the invention.

BRIEF DESCRIPTION OF THE DRAWINGS

The invention may best be understood by reference to the following description taken in conjunction with the accompanying drawings in which.

DETAILED DESCRIPTION

The following embodiments describe techniques for manufacturing semiconductor devices of various sizes using a single mask set.

It will be obvious, however, to one skilled in the art, that the present invention may be practiced without some or all of these specific details. In other instances, well-known operations have not been described in detail in order not to unnecessarily obscure the present invention.

The current invention reduces expensive mask costs for semiconductor devices by utilizing a single mask set for multiple die sizes to reduce mask cost. This approach also offers a better granularity in die sizes which in turn reduces silicon cost by improving the net die per wafer. Multiple tiles, each with a set of fixed resources, are exposed in a single reticle. Each tile can be connected to adjacent tiles to create a larger device or a tile array. Tiles can be connected through inter-tiled connections that are wired through the scribe region between adjacent tiles. By having configurable tiles that are connectable to other adjacent tiles, the mask can be reused to create devices of different sizes, i.e., design sizes. For example, if more resources are needed, a single tile can be connected to one or more adjacent tiles through interconnect lines that allow communication between the resources in the connected tiles. The number of tiles that can be combined may depend on the size of an individual tile and the size of the reticle used. The net die per wafer can also be improved as the tiles are identical and thus can be better arranged on a reticle to maximize the number of tiles that can be exposed on a wafer.

Figure 1:
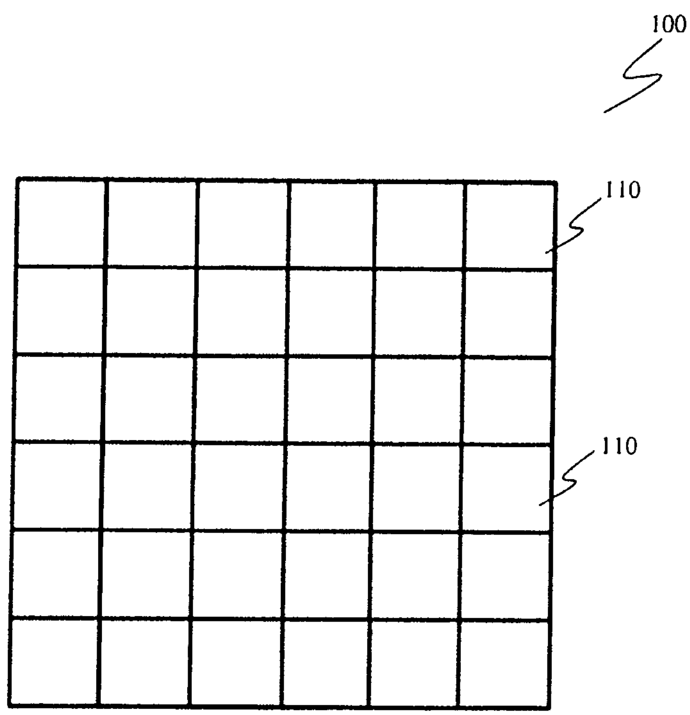
FIG. 1, meant to be illustrative and not restrictive, shows a plurality of tiles 110 in an example reticle exposure 100.

FIG. 1, meant to be illustrative and not restrictive, shows a plurality of tiles 110 in an example reticle exposure 100. Even though only a few tiles 110 are shown in FIG. 1, one skilled in the art should appreciate that the number of tiles 110 that can be fitted into a reticle 100 depends on the size of the tiles 110 and the size of the reticle 100 used. FIG. 1 shows a 6×6 collection of tiles 110 within a single reticle exposure 100 as an exemplary embodiment of the present invention. Each of the tiles 110 contains a collection of fixed resource blocks and flexible resource blocks used for logic implementation. In one embodiment, tiles 110 in reticle 100 are identical.

Figure 2A:
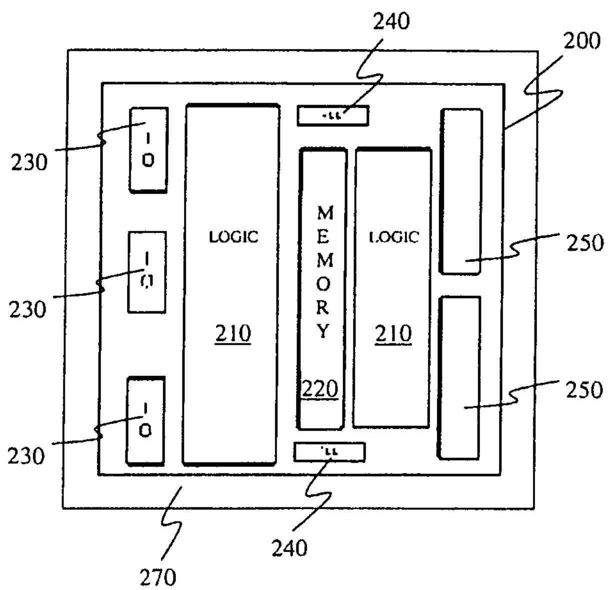
FIG. 2A, meant to be illustrative and not limiting, shows a single tile 200 with a collection of resources as an exemplary embodiment of the present invention.

FIG. 2A, meant to be illustrative and not limiting, shows a single tile 200 with a collection of resources as an exemplary embodiment of the present invention. Tile 200 contains a collection of fixed resource blocks which includes a plurality of I/O banks 230, a plurality of auxiliary circuits 240, a plurality of transceiver blocks 250 and a memory block 220. In some embodiments, auxiliary circuits 240 are PLLs. In other embodiments, auxiliary circuits 240 are DLLs. Logic blocks 210 in tile 200 are used for logic implementation. In one embodiment, logic blocks 210 are flexible resource blocks that contain logic cells or gates that can be configured to implement the intended logic function. In another embodiment, the logic blocks are logic blocks of a programmable logic device (PLD). Even though all the different resource blocks are arranged in a specific manner in FIG. 2A, one skilled in the art should appreciate that one or more of the resource blocks can be arranged differently. Scribe region 270 surrounds the perimeter of tile 200. In one embodiment, scribe region 270 is a scribe lane area not wider than 150 μm for sawing tile 200 from the wafer containing tile 200. In one embodiment, collections of tiles 200 can be connected together to form a "tile array" or a larger die. In another embodiment, a single tile 200 forms a single die on the wafer. In yet another embodiment, tile 200 is made up of numerous metallization layers.

Figure 2B:
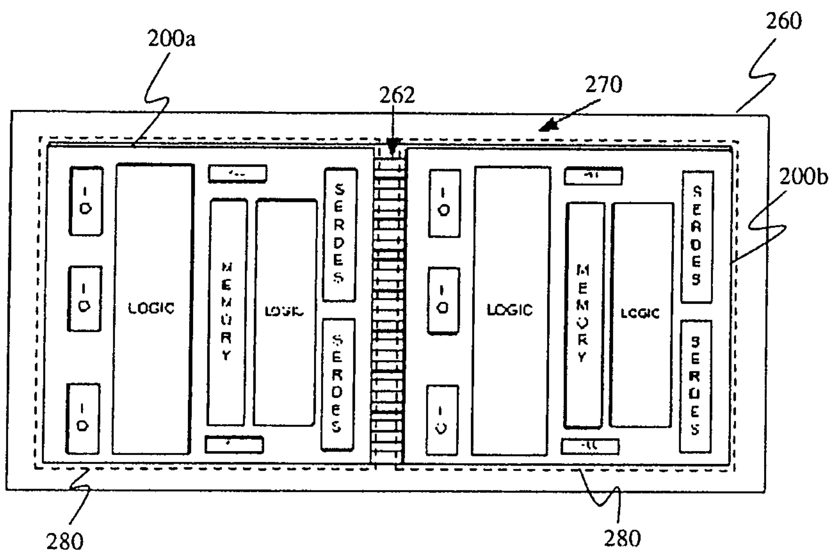
FIG. 2B, meant to be illustrative and not restrictive, illustrates a 2×1 tile array 260 formed with interconnect lines 262.

FIG. 2B, meant to be illustrative and not restrictive, illustrates a 2×1 tile array 260 formed with interconnect lines 262. Tile array 260 comprises two individual tiles 200*a* and 200*b* with a plurality of resource blocks as described above. In one embodiment, interconnect lines 262 are cross-tile metal connections that connect the resources in tiles 200*a* and 200*b*. Interconnect lines 262 enable communication between resources in tile 200*a* with resources in tile 200*b*. In another embodiment, collections of tiles 200*a* and 200*b* that form a larger tile array increase the number of available resources by an appropriate multiplier. For instance, tile array 260 with two tiles, i.e., tiles 200*a* and 200*b*, will have two times the number of resources in a single tile. In one embodiment, each of tiles 200*a* and 200*b* is surrounded with a sealing mechanism 280 that protects the various resource blocks in each of the tiles. In such an embodiment, interconnect lines 262 are routed through sealing mechanism 280. In one embodiment, tile array 260 forms a single die on a wafer and scribe region 270 is used to saw the die 260 from the wafer. Even though only two tiles 200*a* and 200*b* are shown in FIG. 2B, one skilled in the art should appreciate that more tiles can be connected through interconnect lines 262 to form a larger tile array 260 based on a design requirement.

Figure 3:
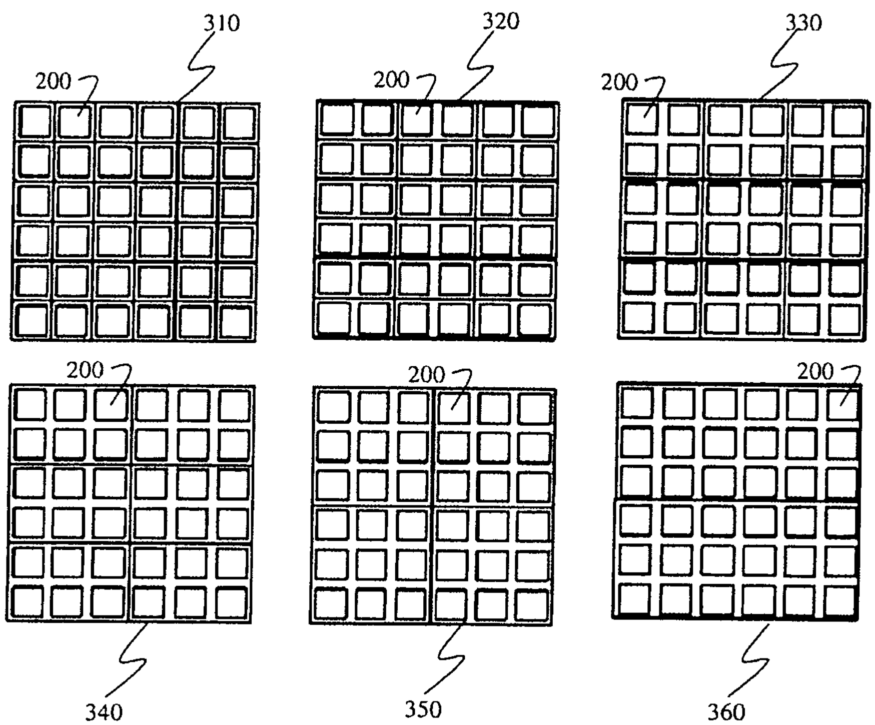
FIG. 3, meant to be illustrative and not restrictive, shows exemplary tile combinations using a 6×6 tile arrangement in a single reticle.

FIG. 3, meant to be illustrative and not restrictive, shows exemplary tile combinations using a 6×6 tile arrangement in a single reticle. In an exemplary embodiment, each reticle exposure 310, 320, 330, 340, 350 and 360 each measure 24 mm×24 mm and tile 200 is a 4 mm×4 mm tile. Reticle exposure 310 has a plurality of individual tiles 200 that form a total of 36 bases or dies per exposure field with a 6×6 arrangement. In this instance, each individual tile 200 in reticle exposure 310 forms an individual die or a layer of a die. Reticle 320 shows an exemplary reticle exposure with a plurality of 2×1 tile arrays to form a total of 18 bases in reticle exposure 320. In one embodiment, there are 36 individual tiles 200 in reticle exposure 320. Each tile 200 in reticle exposure 320 is connected to an adjacent tile to form a 2×1 tile array. In another embodiment, tiles in each of the 2×1 tile array in reticle exposure 320 are connected with interconnect lines 262, similar to that shown in FIG. 2B. Reticle exposure 330 shows 9 individual bases. Each of the bases is formed by a 2×2 tile array. In one embodiment, the 2×2 tile array in each of the 9 bases is connected to one another through interconnect lines and each of the bases can be separated from the wafer by sawing through a scribe region that surrounds each of the bases.

Figure 4A:
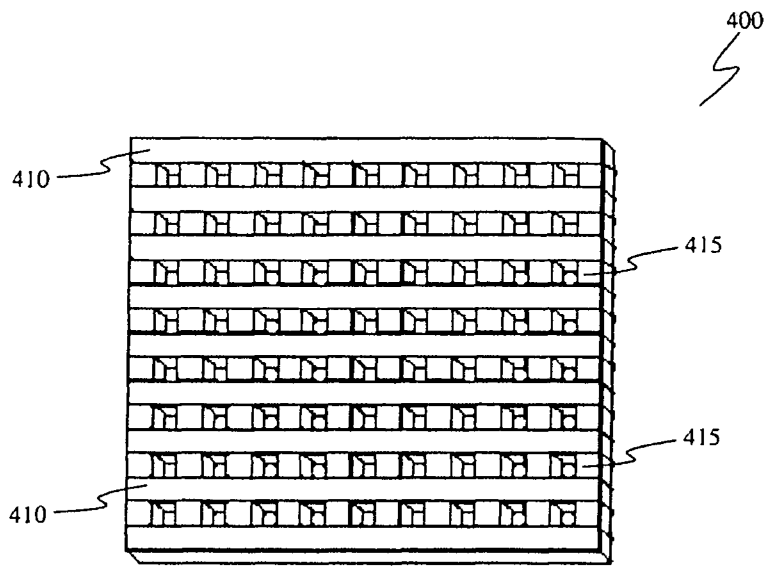
FIG. 4A shows an example die seal 400 that is constructed around the perimeter of a die to avoid contamination during the wafer saw step.

Still referring to FIG. 3, reticle exposure 340 shows an exposure field with 6 bases. Each of the 6 bases is formed by a 3×2 tile array. Reticle exposure 350 shows an exposure field with 4 bases formed by four 3×3 tile arrays. Similarly, reticle exposure 360 shows two bases per exposure field by connecting a total of 18 tiles together to form a 3×6 tile array in each of the two bases. In one embodiment, the size of the tile array increases the area of the base or die produced by an appropriate multiplier. For example, a 2×1 tile array similar to that shown in reticle exposure 320 increases the total area of the base by 100% compared to a 1×1 tile as shown in reticle exposure 310 and the area of a 2×2 tile array as shown in reticle exposure 330 is twice as big as that of a 2×1 tile array. In another embodiment, tiles 200 in each of reticle exposures 310-360 are evenly spaced. Still referring to FIG. 3, an exemplary 6×6 tile arrangement in a single reticle exposure produces at least six different tile combinations. In an exemplary embodiment, a single mask set produces dies of different sizes with different number of resources. The tile combinations and arrangements in reticle exposures 310-360 shown in FIG. 3 are meant to be illustrative and not limiting. One skilled in the art should appreciate that the number of tiles that can be included in a single reticle exposure is based on the size of the tile and reticle used. Therefore, in one embodiment, the maximum size of a die that can be produced depends on the maximum reticle exposure size. In another embodiment, tiles 200 are combined to form tile arrays with aspect ratios not exceeding 2:1 to produce a series of bases. The aspect ratio in this embodiment is represented by the number of tiles 200 horizontally by the number of tiles 200 vertically within a tile array FIG. 4A shows an exemplary die seal 400 that is constructed around the perimeter of a die to avoid contamination during the wafer saw step. Each die or device on a wafer is typically surrounded with a sealing mechanism to protect the intricate circuitry on the die from external contaminants. Referring to FIG. 4A, die seal 400 is made of a fully populated stack of metal 410 and vias 415. In one embodiment in accordance with the present invention, die seal 400 is constructed such that interconnect lines can be routed through die seal 400 if a tile or die is connected to one or more adjacent tiles. FIG.

4B, meant to be illustrative and not limiting, is a simplified illustration that shows how interconnect lines 420 can be routed through opening 430 in die seal 400. In one embodiment, die seal opening 430 is referred to as a "die seal window".

Figure 4B:
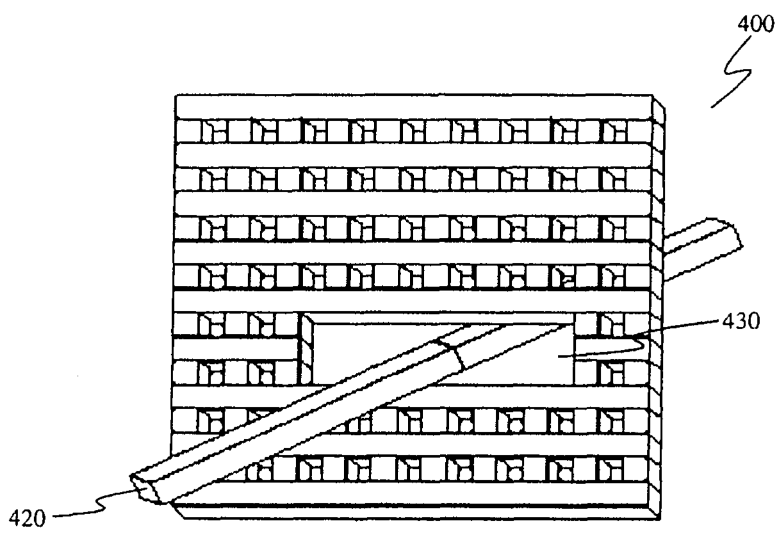
FIG. 4B, meant to be illustrative and not limiting, is a simplified illustration that shows how interconnect lines 420 can be routed through opening 430 in die seal 400.
Figure 4C:
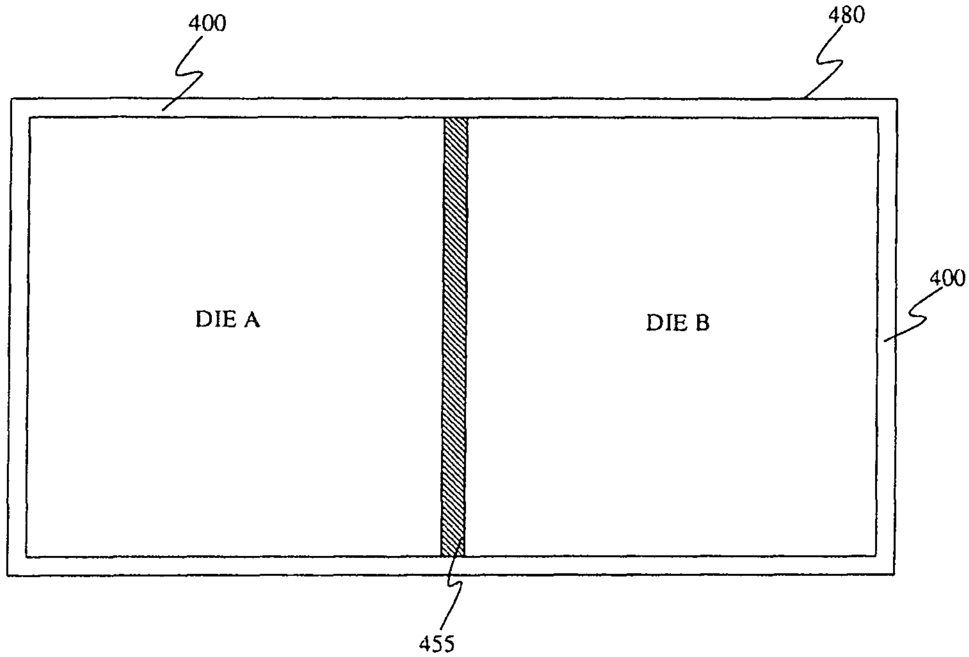
FIG. 4C, meant to be illustrative and not limiting, shows a top down view of two tiles, Tile A and Tile B, each surrounded by die seal 400, connected together to form die or base 480.

FIG. 4C, meant to be illustrative and not limiting, shows a top down view of two tiles, Tile A and Tile B, each surrounded by die seal 400, connected together to form die or base 480. In one embodiment, interconnect lines 420 of FIG. 4B are cross-tile metal interconnects that connect resources in one tile to another. Die seal 400 surrounds Tile A and Tile B. Shaded area 455 of die seal 400 in between Tile A and Tile B has a plurality of openings 430 of FIG. 4B or "die seal windows" that allows interconnect lines 420 to be routed through die seal 400 that surrounds each die. In some embodiments, openings 430 in die seal 400 surrounding Tile A is aligned with openings 430 in die seal 400 surrounding Tile B. In other embodiments, openings 430 in die seal 400 are not aligned and flexible interconnect lines 420 are routed through openings 430 in die seal 400 that surrounds both Tile A and Tile B.

Figure 5:
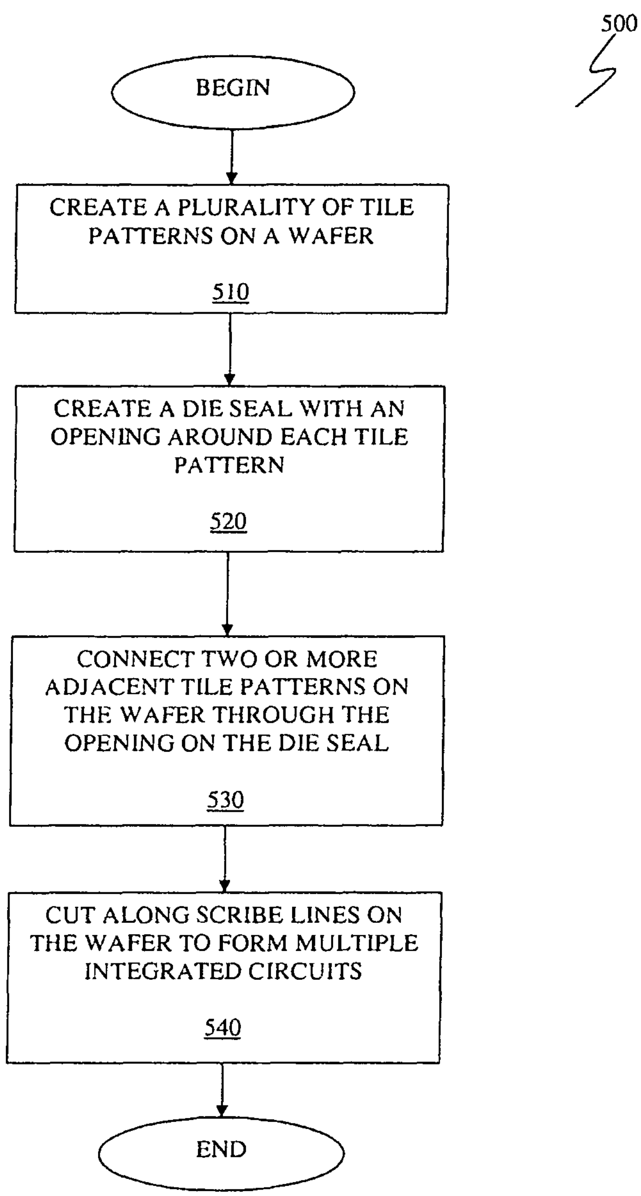
FIG. 5 shows a simplified flow chart 500 with method steps to manufacture an integrated circuit (IC) as an embodiment in accordance with the present invention.

FIG. 5 shows a simplified flow chart 500 with method steps to manufacture an integrated circuit (IC) as an embodiment in accordance with the present invention. A plurality of tile patterns is created on a wafer in operation 510. In one embodiment, the plurality of tile patterns is created with a single reticle exposure similar to reticle exposure 100 shown in FIG. 1. In an exemplary embodiment, each of the tile patterns has a plurality of fixed resource blocks similar to tile 200 shown in FIG. 2A. A die seal with an opening is created in operation 520. The die seal surrounds the fixed resources in each of the tile patterns. In one embodiment, the die seal is similar to die seal 400 with opening 430 shown in FIG. 4B. Two or more adjacent tile patterns on the wafer are connected through the opening on the die seal in operation 530. In one embodiment, interconnect lines, like interconnect lines 420 shown in FIG. 4B, connect the fixed resources in one tile pattern to the fixed resources in an adjacent tile. The wafer is cut along scribe lines on the wafer to form multiple ICs in operation 530. In an exemplary embodiment, the scribe lines are formed by a scribe region in each of the tile patterns similar to scribe region 270 shown in FIG. 2A.

The invention offers considerable savings in mask cost. In respect to a 6-member structured ASIC device family, assuming a 60 mask step process utilizing 10 metal/via layers with 2 custom metal and 2 custom via layers, the total number of diffusion and metal layers for each member of the device family is as follows: 40 diffusion layers, i.e., foundry layers, 8 common metal layers, 8 common via layers, 2 custom metal layers and 2 custom via layers. As a result, based on this example, a total of 56 masks (40 diffusion masks+8 metal masks+8 via masks) would be required for each member of the device family. As such, a total of 336 (6×56) masks (excluding the custom metal and via layers) would be required for the whole family of devices based on this calculation if a new set of masks is required for each member of the device family. However, the present invention allows a single set of masks to be used for a variety of design sizes with varying resources. Therefore, in this example, the present invention reduces the number of masks from 336 to 56 because a single mask set can be used for the whole device family. As the number of masks translates directly to mask making charges, based on this example, the present invention reduces mask cost by 80%.

The embodiments, thus far, were described with respect to integrated circuits. The method and apparatus described herein may be incorporated into any suitable circuit. For example, the method and apparatus may be incorporated into numerous types of devices such as microprocessors or programmable logic devices. Exemplary programmable logic devices include programmable array logic (PAL), programmable logic array (PLA), field programmable logic array (FPLA), electrically programmable logic devices (EPLD), electrically erasable programmable logic device (EEPLD), logic cell array (LCA), field programmable gate array (FPGA), application specific standard product (ASSP), application specific integrated circuit (ASIC), just to name a few.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by the assignee.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A die, comprising:

a plurality of tiles, each tile forming a layer of the die, the tiles comprising, a plurality of fixed resource blocks, a plurality of logic blocks, wherein a tile is configurable to couple to one or more adjacent tiles through interconnect lines routed through a die seal defined within a scribe region surrounding the plurality of tiles, the interconnect lines configured for communicating with the plurality of fixed resource blocks and the plurality of logic blocks in the one or more adjacent tiles, the interconnect lines traversing through at least one opening within the die seal, the at least one opening located above a bottom metallization line and below a top metallization line of the tile.

2. The die of claim 1, wherein each tile is surrounded by a dedicated die seal.

3. The die of claim 1, wherein the at least one opening within the die seal is aligned with an opening within a die seal of the one or more adjacent tiles.

4. The die of claim 3, wherein the at least one opening on the die seal is based on a design configuration.

5. The die of claim 1, wherein one of the plurality of fixed resource blocks comprises memory blocks.

6. The die of claim 1, wherein one of the fixed resource blocks comprise I/O banks.

7. The die of claim 1, wherein one of the fixed resource blocks comprise transceivers.

8. The die of claim 1, wherein the plurality of tiles can be partitioned based on a design configuration.

9. The die of claim 1, wherein the die seal defines a perimeter of each tile.

10. The die of claim 1, wherein the die seal includes a stack of metallization layers coupled through vias.

11. A die, comprising:

a plurality of tiles, each tile defining a layer of the die and having a plurality of fixed resource blocks; and a die seal disposed within an inner boundary of a scribe region surrounding the plurality of tiles, the die seal enabling the plurality of tiles to be coupled to one or more adjacent tiles through interconnect lines routed through an opening defined within a layer of the die seal, the opening located above a bottom metallization line and below a top metallization line of the tile.

12. The die of claim 11, wherein the die seal includes multiple openings.

13. The die of claim 12, wherein the at least one opening is based on a design configuration.

14. The die of claim 11, wherein each tile of the plurality of tiles is identical to other tiles of the plurality of tiles.

15. The die of claim 11, wherein the die is one of a plurality of dies disposed on a wafer.

16. The die of claim 15, wherein an aspect ratio of the plurality of dies does not exceed 2:1.

17. A tile comprising:

a plurality of fixed resource blocks; and a plurality of logic blocks, wherein said tile is configurable to couple to one or more adjacent tiles through interconnect lines routed through a die seal disposed inside a scribe region surrounding the tile and the one or more adjacent tiles, wherein the interconnect lines are configured for facilitating communication between the plurality of fixed resource blocks and the plurality of logic blocks of one or more adjacent tiles, and wherein the tile forms a die layer, the interconnect lines traversing through at least one opening within the die seal, the at least one opening located above a bottom metallization line and below a top metallization line of the tile.

18. The tile of claim 17, wherein the die seal includes a stack of metallization layers coupled through vias.

19. The tile of claim 17, wherein the one or more adjacent tiles are disposed inside the scribe region.

20. The wafer of claim 17, wherein the die seal defines a perimeter of the tile.

* * * * *